United States Patent
Lin et al.

(10) Patent No.: US 6,958,494 B2
(45) Date of Patent: Oct. 25, 2005

(54) LIGHT EMITTING DIODES WITH CURRENT SPREADING LAYER

(75) Inventors: Hui-Li Lin, Richmond, CA (US); Qinghong Du, Hercules, CA (US); Ho-Shang Lee, El Sobrante, CA (US)

(73) Assignee: DiCon Fiberoptics, Inc., Richmond, CA (US)

( * ) Notice: Subject to any disclaimer, the term of this patent is extended or adjusted under 35 U.S.C. 154(b) by 13 days.

(21) Appl. No.: 10/641,641

(22) Filed: Aug. 14, 2003

(65) Prior Publication Data

US 2005/0035354 A1 Feb. 17, 2005

(51) Int. Cl.[7] .............................................. H01L 31/12
(52) U.S. Cl. ............................ 257/86; 257/94; 257/103
(58) Field of Search .............................. 257/86, 94, 103

(56) References Cited

U.S. PATENT DOCUMENTS

| | | | |
|---|---|---|---|
| 5,008,718 A | | 4/1991 | Fletcher et al. |
| 5,955,749 A | | 9/1999 | Joannopoulos et al. |
| 5,977,566 A | * | 11/1999 | Okazaki et al. ............... 257/99 |
| 6,420,732 B1 | * | 7/2002 | Kung et al. .................... 257/79 |
| 6,515,306 B2 | * | 2/2003 | Kuo et al. ...................... 257/82 |
| 6,577,661 B1 | * | 6/2003 | Wang et al. ................... 372/45 |
| 6,580,096 B2 | | 6/2003 | Chen et al. |
| 2003/0141507 A1 | | 7/2003 | Krames et al. |

* cited by examiner

Primary Examiner—Allan R. Wilson
(74) Attorney, Agent, or Firm—Parsons Hsue & De Runtz LLP (57) ABSTRACT

A light-emitting diode (LED) for both AlGaInP- and GaN-based materials needs a good transparent current spreading layer to disseminate electrons or holes from the electrode to the active layer. The present invention utilizes a conductive and transparent ITO (Indium Tin Oxide) thin film with an ultra-thin (to minimize the absorption) composite metallic layer to serve as a good ohmic contact and current spreading layer. The present invention avoids the Schottky contact due to direct deposition of ITO on the semiconductor. For AlGaInP materials, a thick GaP current spreading layer is omitted by the present invention. For GaN-based LEDs with the present invention, semi-transparent Ni/Au contact layer is avoided. Therefore, the light extraction of LED can be dramatically improved by the present invention. Holes may be etched into the semiconductor cladding layer forming a Photonic Band Gap structure to improve LED light extraction.

36 Claims, 6 Drawing Sheets

LIGHT EMITTING DIODES WITH CURRENT SPREADING LAYER

FIELD OF THE INVENTION

The invention relates to the structure and fabrication of light emitting diodes. In particular, the invention can improve the light extraction efficiency and increase the light output.

BACKGROUND OF THE INVENTION

AlGaInP-based materials grown on lattice-matched GaAs substrates and GaN-based materials grown on sapphire or SiC substrates have led to major advances in high-brightness LEDs. That LED produces high brightness and posses complete visible spectrum to make solid-state lighting possible. The advancement of LED technology is attributed to the developments of advanced epitaxial growth technologies such as molecular beam epitaxy (MBE) and metal-organic chemical vapor deposition (MOCVD). The conventional growth techniques such as liquid phase epitaxy (LPE) and hydride vapor phase epitaxy (HVPE) were not suitable for growing AlGaInP crystal layer. The advanced epitaxial growth technologies enable the formation of high-quality alloy of III–V materials. They facilitate band gap engineering such as heterostructure and multiple quantum wells (MQWs) structure, which in turn increase the internal quantum efficiency and produce more light output. However, some other technical issues such as current spreading, light extraction efficiency, and heat dissipation must be resolved in order to obtain high-brightness LEDs (high wall-plug efficiency and large power output).

Figure 1A:
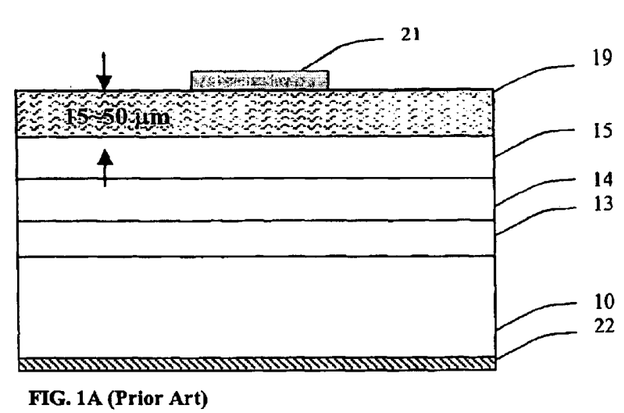
FIG. 1A shows a cross-section view of a first prior art AlGaInP-based LED.

The most popular technique to solve the current spreading problem is presented in the U.S. Pat. No. 5,008,718. The LED structure cited in this patent is illustrated in FIG. 1A. Epitaxial layers are grown on the top of the n-GaAs substrate 10 in the following order: n-type AlGaInP cladding layer 13, active layer 14 in double heterostructure with p-type AlGaInP cladding layer 15 over the active layer and then a thick window layer GaP 19 (15–60 $\mu$m). The electrodes 21 and 22 are deposited on both sides of the structure. The advantages of using the window layer GaP 19 are that it is transparent and highly electrically conductive. But, its drawback is the extremely high thickness, which results in increasing manufacturing cost. The thick window layer is also not suitable for some device configurations—such as resonant cavity LEDs (RCLEDs) and creating photonic bandgap (PBG) in LED devices.

Figure 1B:
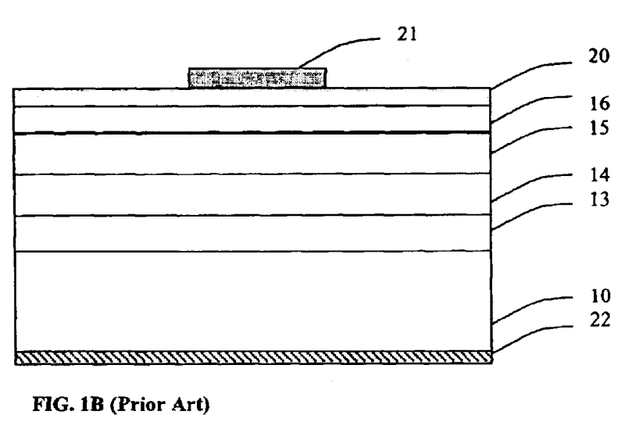
FIG. 1B shows a cross-section view of a second prior art AlGaInP-based LED.
Figure 1C:
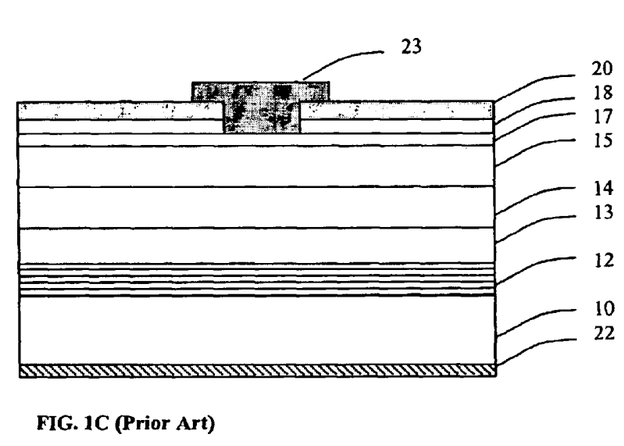
FIG. 1C shows a cross-section view of a third prior art AlGaInP-based LED.

Alternatively, a conductive transparent material—Indium Tin Oxide (ITO) is studied and applied as a current spreading layer. FIG. 1B and FIG. 1C show the prior art of the LEDs with ITO current spreading layer. The ITO layer 20 in FIGS. 1B and 1C replaces the GaP layer 19 in FIG. 1A to serve as current spreading layer. FIG. 1B structure was disclosed in U.S. Pat. No. 5,481,122. The epitaxial structure of FIG. 1B is same as that in FIG. 1A except that a p-type contact layer 16 is inserted between the ITO layer 20 and cladding layer 15. The transmission coefficient of ITO layer 20 is about 90% in the visible range. The electrical resistivity of n-type ITO (around 2~5×10$^{-4}$ Ω-cm) is 100 times smaller than that of p-type GaP. However, a Schottky contact is formed between the ITO layer 20 and p-type contact layer 16. It degrades performance of the LEDs.

FIG. 1C shows the prior art disclosed in U.S. Pat. No. 6,580,096. Compared to the FIG. 1A, a Distributed Bragg Reflector (DBR) layer 12 is added between the layer 13 and the substrate 10 to reduce the absorption of light in the absorbed substrate 13. There are two lightly p-doped window layers 17 (GaP) and 18 (GaAs) to be added between the ITO layer 20 and the p-type cladding layer 15. The layer 17 is used to form an ohmic contact and to facilitate current spreading. The ohmic contact issue is perhaps resolved by such structure. However, the process is much more complicated and current spreading is still an issue due to the lateral contact.

Figure 2:
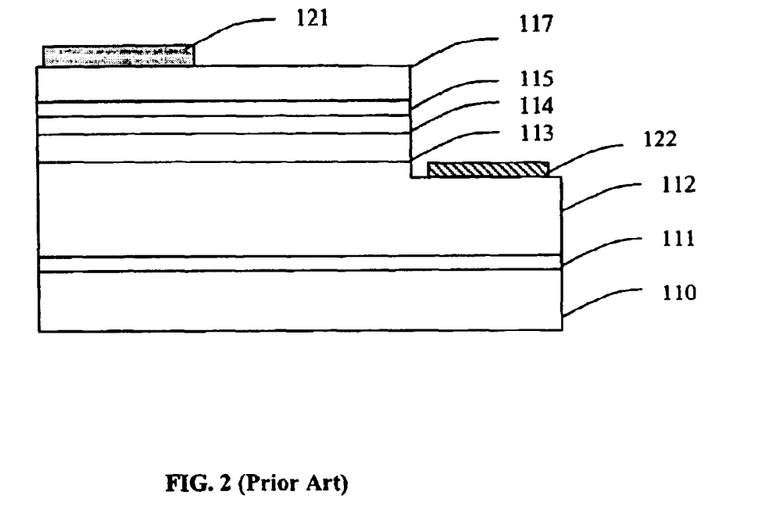
FIG. 2 shows a cross-section view of an addiitonal prior art GaN-based LED.

For GaN material, the semi-transparent p-type ohmic contact NiO/Au (transparency is about 60%) is used as current spreading. But it suffers from low transmission. FIG. 2 shows the prior art LED presented in the paper *Semicond. Sci. Technol.* 18 (2003) L21–L23. An ITO layer 117 is deposited on the GaN-based LED structure, which contains in the following order: sapphire substrate 110, a thin GaN nucleation layer 111, n-type GaN cladding layer 112, active layer 113, p-type cladding layer AlGaN 114, and p-type GaN contact layer 115. The electrodes 121 and 122 are fabricated on the ITO layer 117 and n-GaN 112, respectively. The major drawback is the Schottky contact formed between ITO 117 and the p-type GaN contact layer 115; such contact causes reliability problems.

SUMMARY OF THE INVENTION

According to one embodiment of the invention, a light emitting diode comprises an active light emission layer and a semiconductor layer over the active layer which pases light emitted by the active layer as light output from the diode. A current spreading composite layer is employed on the semiconductor layer. The composite layer includes a first metallic layer in contact with said semiconductor layer, and a second current spreading layer comprising indium tin oxide in contact with said first metallic layer. The two layers in the current spreading composite layer are substantially transparent to light emitted by the active layer.

According to an additional embodiment of the invention, a light emitting diode comprises an active light emission layer and a semiconductor layer over the active layer which pases light emitted by the active layer as light output from the diode. A current spreading composite layer is employed on the semiconductor layer. The composite layer includes a first metallic layer of not more than about 8 nm in total thickness in contact with said semiconductor layer, and a second current spreading layer in contact with said first metallic layer. The two layers in the current spreading composite layer are substantially transparent to light emitted by the active layer.

Another embodiment of the invention covers a method for making a light emitting diode. An active light emission layer is formed over a substrate and a semiconductor layer is formed over the active layer. A current spreading composite layer is provided on said semiconductor layer. The composite layer comprises a first metallic layer in contact with said semiconductor layer, and a second current spreading layer in contact with said first metallic layer. The two current spreading layers are substantially transparent to light emitted by the active layer. In one implementation, the second current spreading layer comprising indium tin oxide, and in another, the first metallic layer provided is not more than about 8 nm in total thickness

BRIEF DESCRIPTION OF THE DRAWINGS

For simplicity in description, identical components are labeled by the same numerals in this application.

DETAILED DESCRIPTION OF THE INVENTION

One embodiment of the present invention provides novel LED structures and a method for manufacturing such light emitting diode structures comprising a transparent conductive ITO current spreading layer with an ultra-thin composite metallic layer beneath it on p-type semiconductor to form a good ohmic contact. High transparency of ITO and low absorption of ultra-thin composite metallic layer does not degrade light extraction. On the contrary, the light extraction is significantly increased due to better current spreading and ohmic contact.

Light emitting diodes may be manufactured with a simple current spreading layer on wafer level using e-beam and sputtering techniques. The light emitting portions of the diode structures can be the same as those in any conventional LED structures. Also, the concept described herein can be applied to RCLEDs structures and PBG-inscribed LED structure. The process is simple, controllable, and reproducible. Therefore, it is suitable for low cost mass manufacturing. Also the current spreading layer with intermediate metallic layer can be applied to the texture surfaces or two-dimensional PBG slabs of certain LEDs.

In a first embodiment of the present invention, a light emitting diode comprises an ultra-thin composite metallic layer between the transparent current spreading layer and p-type semiconductor layer to form a good ohmic contact without sacrificing the light transparency. The ultra-thin metallic layer comprises at least one type of metal. Typically two metal layers such as a first layer of titanium and a second layer of gold may be deposited to form the ultra-thin composite layer. Here, the titanium layer serves as surface cleaning and adhesive agent when deposited over or on the p-type semiconductor layer. The second transparent current spreading layer is a thick ITO layer or its equivalents. The ultra-thin composite metallic layer will facilitate connection to the ITO layer to form an excellent ohmic contact after Rapid Thermal Annealing (RTA) treatment around 330~440° C. for 0.5 to 2 minutes, which causes some of the metallic layer to diffuse into the ITO layer. The metal thickness of the ultra-thin composite metallic layer is optimized to form an excellent ohmic contact and minimize the light absorption from the active layer.

The p-type bonding pad can be formed on the top of the ITO layer by titanium and gold layers.

The present invention is equally applicable to n-type semiconductor LEDs with the ITO combined with ultra-thin composite metallic layer.

Figure 3A:
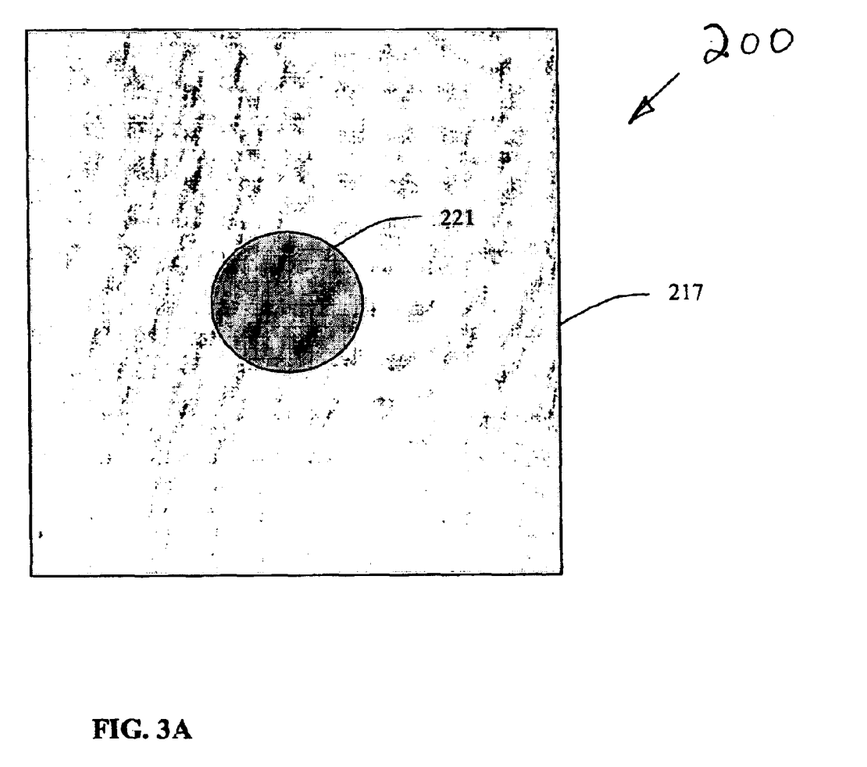
FIG. 3A is schematic top view of AlGaInP-based light emitting diode to illustrate an embodiment of the invention.
Figure 3B:
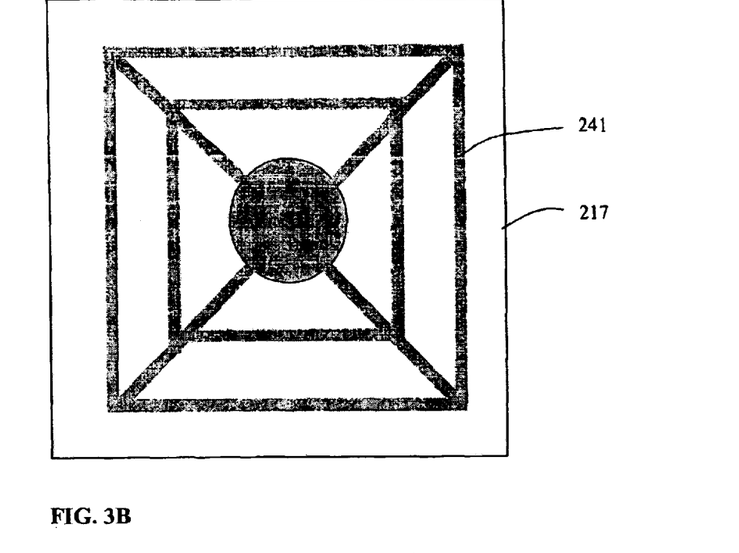
FIG. 3B shows the bonding pad in a mesh configuration to illustrate an embodiment of the invention.
Figure 4:
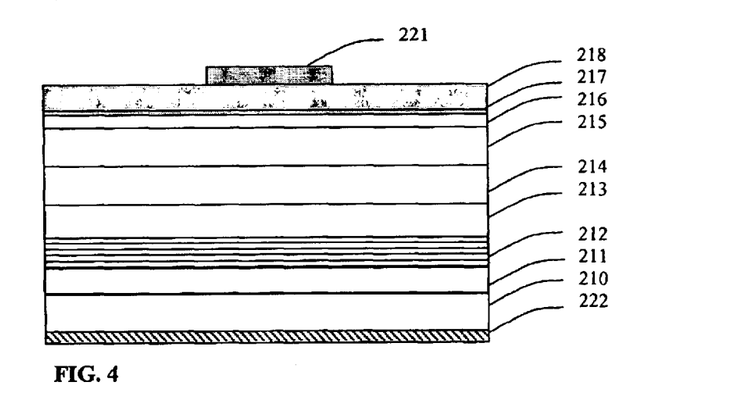
FIG. 4 is a cross section view of AlGaInP-based light emitting diode to illustrate an embodiment of the invention.
Figure 5:
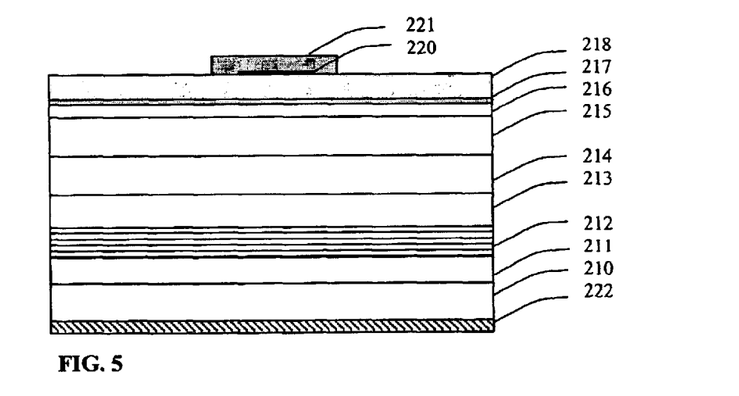
FIG. 5 is a cross section view of AlGaInP-based light emitting diode with current blocking layer under bonding pad to illustrate an alternative embodiment of the invention.

The first embodiment in the present invention is illustrated schematically in FIG. 3–5 for the LED structure 200 and LED device of AlGaInP-based materials. FIG. 3 shows the top metal (Ti/Au etc.) bonding pad 221 on ITO layer 218 of the LED 200. In order to obtain better current spreading in any one of the embodiments described herein, the bonding pad 221 can be constructed in a mesh configuration 241 as indicated in FIG. 3B.

As illustrated by the structures in FIG. 4 and FIG. 5, the LED structure is first grown on the lattice-matched n-GaAs substrate 210. An n-GaAs buffer layer 211 is grown followed by a Distributed Bragg Reflector (DBR) 212 of AlGaAs-based or AlGaInP-based materials to reflect the light out of being absorbed by the GaAs substrate. The n-AlGaInP bottom cladding layer 213 is grown and followed by the active layer 214, which can be double heterostructure or multi-quantum well (MQW) to optimize the internal quantum efficiency. Then the p-AlGaInP upper cladding layer 215 is formed with an appropriate optimized doping profile (to maximize current injection and avoid out-diffusion). For the conventional LED structure, the layer 216 will be a thick current spreading semiconductor layer such as GaP and AlGaAs. In the present invention, the layer 216 is replaced by a heavily p-type doped GaP, very thin InGaP, or GaAs contact layer. In addition, an ultra-thin composite metallic layer 217 having at least one metal such as titanium (Ti), gold (Au), zinc (Zn), indium (In) beryllium (Be) or nickel (Ni) within it. For example, one of these metals may be deposited as a first layer on the top of the layer 216. When Ti is used, for example, as the metal in such layer, Ti has the functions of cleaning up and increasing the adhesion with the layer 216. The composite metallic layer may also include metals such as Ti/Au, Ti/Au—Zn, Ti/Au—Be, Ni/Au, Au—Zn, or In—Be, such as in a layer different from the first layer. Such alloys are a few examples for the composition of another layer in the ultra-thin composite metallic layer 217. The total thickness of the ultra-thin composite metallic layer is not more than about 8 nm, and preferably in a range of about 0.4 to 8 nm. An ITO layer 218 of thickness of about 40 to 1,000 nm is applied to the top of the composite metallic layer 217. The ITO layer 218 can have transmission more than 90% and conductivity p about $2 \sim 5 \times 10^{-4}$ Ω-cm. The composite metallic layer 217 and ITO layer 218 can be deposited using e-beam (electron beam directed to a metallic material), sputtering or other deposition techniques. Such techniques are known to those skilled in the art and will not be described here. Thereafter, the full substrate is subjected to a Rapid Thermal Annealing (RTA) treatment at 330–440° C. to assist the composite metallic layer 217 to form a good ohmic contact with ITO and the layer 216. To further enhance the current spreading to cover the area of the active layer 214, a dielectric film such as $SiO_2$ or $Si_3N_4$ 220 can be deposited locally underneath the bonding pad 221 as shown in FIG. 5. The bottom ohmic contact layer 222 is formed out of Ni/Au—Ge.

Figure 6:
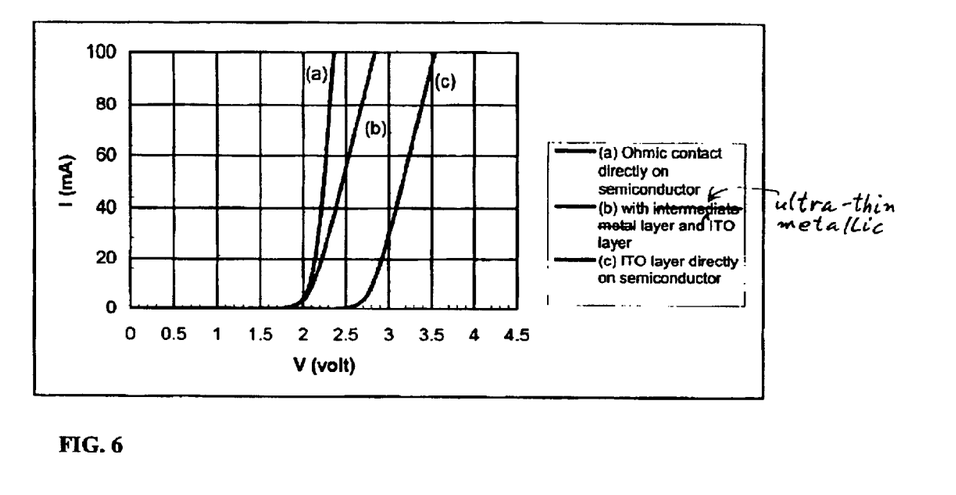
FIG. 6 is a graphical illustration of I–V characteristics of the light emitting diode with different contact configurations to illustrate I–V characteristics of an embodiment of the invention.

FIG. 6 shows the I–V characteristics for different device configurations for AlGaInP-based LEDs—(a) contact metal formed on the semiconductor directly, (b) ITO coated with an ultra-thin composite metallic layer of the present invention, and (c) ITO coated on the semiconductor directly. It can be seen that the LED forward voltage $V_f$ measured with a 20 mA current injection is 2.0V, 2.2V, and 2.85V for cases (a), (b), and (c), respectively. It is clear that the forward voltage Vf of Case (b) is 0.65 V less than that of Case (c).

Figure 7:
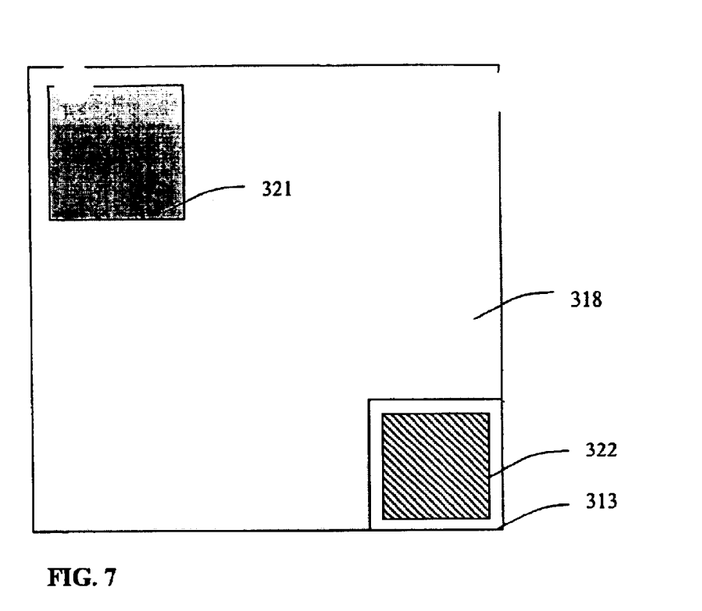
FIG. 7 is schematic top view of GaN-based light emitting diode to illustrate an alternative embodiment of the invention.
Figure 8:
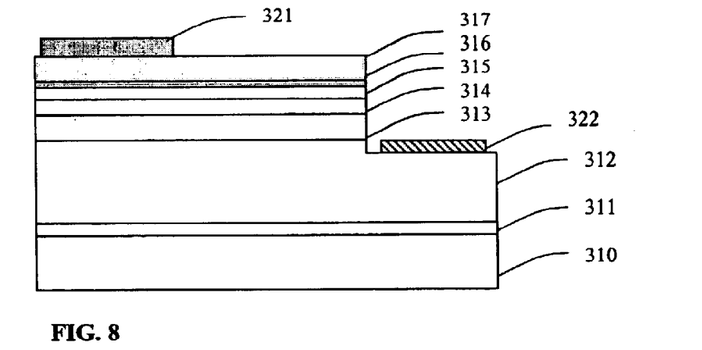
FIG. 8 is a cross section view of GaN-based light emitting diode to illustrate yet another alternative embodiment of the invention.
Figure 9:
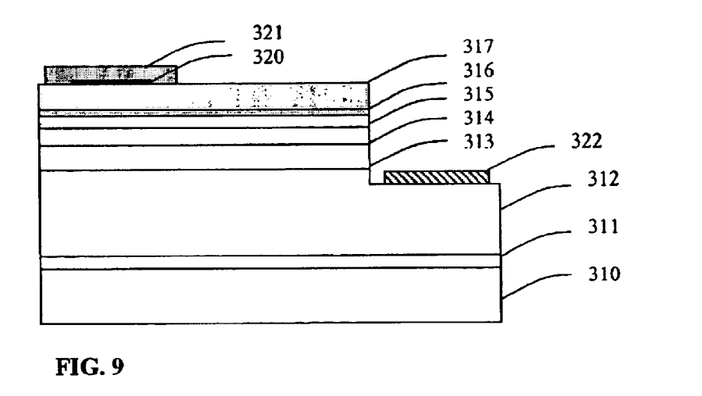
FIG. 9 is a cross section view of GaN-based light emitting diode with current blocking layer under bonding pad to illustrate still yet another alternative embodiment of the invention.

A second embodiment in the present invention is illustrated schematically in FIG. 7–9 for the LED structure and LED device of GaN-based materials. FIG. 7 shows the top metal (Ni/Au etc.) bonding pad 321 of the LED.

As illustrated by the structures shown in FIG. 8 and FIG. 9, the LED structure is first grown on the lattice-mismatched insulating sapphire substrate 310 using MOCVD. A very thin low temperature GaN nucleation layer 311 is grown, followed by a thick n-type GaN 312. The active layer 313 comprises several InGaN/GaN strained MQWs. Finally, the p-AlGaN upper cladding layer 314 for electrical confinement and p-GaN contact layer 315 are deposited.

In the conventional LED structure, the current spreading layer is a thin semi-transparent metal layer such as NiO/Au (transmission is around 60% with thickness of 10/30 nm). In the present invention, an ultra-thin composite metallic layer such as Ti/Au, Ti/Au—Zn, Ti/Au—Be, Ti/In—Be or Ni/Au 316, followed by a transparent and conductive ITO layer 317 can be coated using e-beam and sputtering techniques. Thereafter, the wafer is processed to define the contact areas for positive and negative electrodes utilizing typical semiconductor fabrication techniques. The device structure of the GaN-based LED is shown in FIG. 7 and FIG. 8. The top bonding-pad 321 can be formed out of Ti/Au. The n-type ohmic contact 322 can be formed out of Ti/Al/Au. In order to increase the adhesion of the metal, metal Ti is applied with sputtering techniques to increase the bonding energy.

To further enhance the current spreading to cover the area of the active layer 214, a dielectric film such as $SiO_2$ or $Si_3N_4$ 320 can be deposited locally underneath the bonding pad 321 as shown in FIG. 9.

Figure 10:
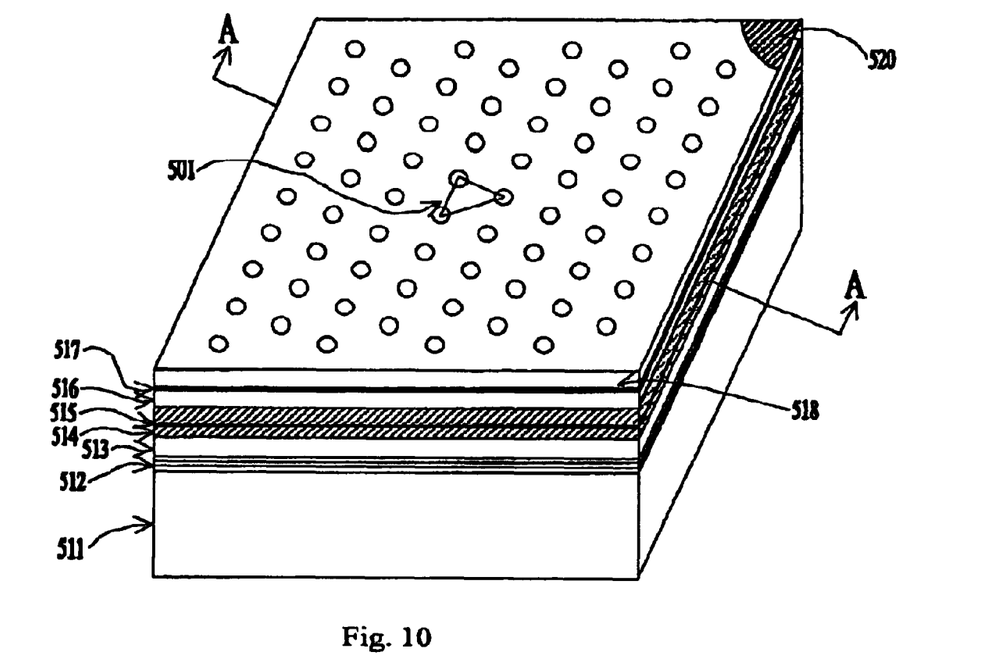
FIG. 10 is a perspective view of a LED structure inscribed with a photonic band gap pattern and covered with a layer of ITO to illustrate another one of an alternative embodiment of the invention.
Figure 11:
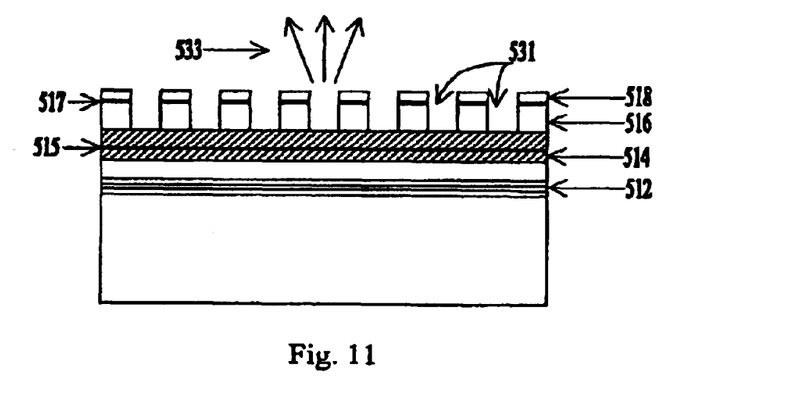
FIG. 11 is the cross-sectional view of the structure of FIG. 10 along the line A—A in FIG. 10.

LED generally suffers from low extraction efficiency due to multiple total internal reflections at the walls of the high index semiconductor materials. Photonic band gap structure or so-called photonic crystal is one the methods proposed herein to increase the extraction efficiency of the LED. A lattice of holes is formed in the semiconductor layers of the LED as indicated in FIG. 10. For LEDs emitting visible light, the hole diameter ranges from 80 to 300 nm and lattice constant from 100 to 400 nm. The lattice pattern can be triangular as indicated by 501 or other patterns such as rectangle and hexagon. The numerals 511, 512, 513, 514 (the shaded layer), and 516 refer to respectively the substrate, DBR, cladding layer, waveguide layer, and cladding layer, respectively. The active layer 515 comprised of multiple quantum well (MQW) or strain MQW is imbedded within the waveguide layer 514. The ultra-thin composite metallic layer as described in FIGS. 4, 5, 8 and 9 is deposited on the top of the semiconductor layer 516. The semiconductor layer 516 in general may consist of multiple semiconductor layers to serve functions such as enhancing electric property in addition to confining the optical power in the waveguide layer 514. ITO 518 is thereafter applied to the top of the ultra-thin composite metallic layer 517. Transparency property and high conductivity of ITO 518 are nicely utilized to this photonic band gap LED. After layers 517, 518 and cladding layer 516 have been formed, holes 531 are etched into these three layers to form the Photonic Band Gap structure, as shown in FIGS. 10 and 11, such as by an electron beam lithography process. The holes etched may extend into and through the semiconductor layer 516. The etching process does not have to etch holes to precise depths. Thus, the LED will still perform adequately even if the holes are etched into the waveguide and active layer 514. Layer 520 is the metal pad for conducting the current to the external electrical terminal. The metal pad 520 is deposited on the top of ITO 518.

FIG. 11 is a cross-section view A—A of the LED structure of FIG. 10, after the ITO layer 518 has been applied to the structure. The light merges from the top of the wafer as indicated by 533. The holes 531 are drilled by etching through the ITO layer 518, the ultra-thin metallic layer 517 and then cladding layer 516. In some cases, the holes 531 may deepen into the waveguide layer 514.

In the fabrication process, the holes of the photonic crystal can also be drilled by etching into the cladding layer 516 first, and then apply the ultra-thin composite metallic and ITO layer later. Therefore holes in the ITO layer are avoided. This can increase the current spreading area without affecting the extraction function of the photonic band gap structure. Also, avoiding etching through ITO makes the hole diameter, depth and shape in the cladding layer more controllable.

While the invention has been described by reference to various embodiments, it will be understood that modification changes may be made without departing from the scope of the invention which is to be defined only by the appended claims or their equivalents. For example, while the embodiments are illustrated with an n-type semiconductor material used as the substrate and the LED is terminated with a p-type semiconductor material from which light is emitted as the light output of the LED, it will be understood that the invention is equally applicable where a p-type semiconductor material is used as the substrate and the LED is terminated with an n-type semiconductor material from which light is emitted as the light output of the LED. Such and other variations are within the scope of the invention. The LED may be implemented in AlGaInP-. AlGaAs-, AlGaN-, InGaN-, or GaN-based or other suitable materials. All references referred to herein are incorporated by reference in their entireties.

What is claimed is:

1. A light emitting diode comprising:
an active light emission layer embedded in a waveguide layer;
a Photonic Band Gap structure adjacent to the active layer;
a semiconductor layer over the active layer, said semiconductor layer passing light emitted by the active layer as light output from the diode;
a current spreading composite layer on said semiconductor layer, said composite layer comprising a first metallic layer in contact with said semiconductor layer, and a second current spreading layer comprising ITO in contact with said first metallic layer, said first and second layers substantially transparent to light emitted by the active layer; and a cladding layer adjacent to the waveguide layer, said structure comprising an array of holes at least in the cladding layer.

2. The light emitting diode according to claim 1, wherein said first metallic layer comprises at least one metal selected from the following: titanium, gold, zinc, indium, nickel, and beryllium.

3. The light emitting diode according to claim 1, wherein said first metallic layer comprises a composite layer.

4. The light emitting diode according to claim 1, wherein one of the layers in said composite layer in said first metallic layer comprises titanium.

5. The light emitting diode according to claim 1, wherein said first metallic layer comprises Ti/Au, Ti/Au—Zn, Ti/Au—Be, Ni/Au, Au—Zn, In—Be, or Ti/In—Be.

6. The light emitting diode according to claim 1, wherein said first metallic layer has a thickness within a range of about 0.4~8 nm.

7. The light emitting diode according to claim 1, said first metallic layer assisting to forming an ohmic contact with said semiconductor layer.

8. The light emitting diode according to claim 1, wherein said second current spreading layer has a thickness within a range of about 40 to 1,000 nm.

9. The light emitting diode according to claim 1, said diode comprising AlGaInP-. AlGaAs-, AlGaN-, InGaN-, or GaN-based materials.

10. The light emitting diode according to claim 1, wherein said semiconductor layer comprises a p-type material.

11. The light emitting diode according to claim 1, said structure comprising a portion of said current spreading composite layer.

12. The light emitting diode according to claim 1, wherein a diameter of holes in said array ranges from 80 to 300 nm.

13. The light emitting diode according to claim 1, wherein a lattice constant of said structure ranges from about 100 to 400 nm.

14. The light emitting diode according to claim 1, wherein a lattice pattern of said structure lattice is triangular, rectangular or hexagonal.

15. The light emitting diode according to claim 1, said structure comprising a portion of said current spreading composite layer and the semiconductor layer.

16. A light emitting diode comprising:
an active light emission layer;
a Photonic Band Gap structure adjacent to the active layer;
a semiconductor layer over the active layer on said semiconductor layer passing light emitted by the active layer as light output from the diode;
a current spreading composite layer on said semiconductor layer, said composite layer comprising a first metallic layer in contact with said semiconductor layer, and a second current spreading layer comprising ITO in contact with said first metallic layer, said first and second layers substantially transparent to light emitted by the active layer, said structure comprising an array of holes in the current spreading composite layer and the semiconductor layer.

17. The light emitting diode according to claim 16, said active layer being embedded in a waveguide layer.

18. The light emitting diode according to claim 17, said active layer comprising multiple quantum wells or double heterostructure in the waveguide layer.

19. A light emitting diode comprising:
an active light emission layer;
a Photonic Band Gap structure adjacent to the active layer;
a semiconductor layer over the active layer, said semiconductor layer passing light emitted by the active layer as light output from the diode;
a current spreading composite layer on said semiconductor layer, said composite layer comprising a first metallic layer in contact with said semiconductor layer, and a second current spreading layer in contact with said first metallic layer, said first and second layers substantially transparent to light emitted by the active layer, wherein said first metallic layer has a total thickness not more than about 8 nm; and
a cladding layer adjacent to the active layer, said structure comprising an array of holes at least in the cladding layer.

20. The light emitting diode according to claim 19, wherein said first metallic layer comprises at least one metal selected from the following: titanium, gold, zinc, indium, Nickel, and beryllium.

21. The light emitting diode according to claim 19, wherein said first metallic layer comprises a composite layer.

22. The light emitting diode according to claim 19, wherein one of the layers in said composite layer in said first metallic layer comprises titanium.

23. The light emitting diode according to claim 19, wherein said first metallic layer comprises Ti/Au, Ti/Au—Zn, Ti/Au—Be, Ni/Au, Au—Zn, In—Be, or Ti/In—Be.

24. The light emitting diode according to claim 19, wherein the second layer comprises ITO.

25. The light emitting diode according to claim 19, said first metallic layer assisting to forming an ohmic contact with said semiconductor layer.

26. The light emitting diode according to claim 19, wherein said second current spreading layer has a thickness within a range of about 40 to 1,000 nm.

27. The light emitting diode according to claim 19, said diode comprising AlGaInP-. AlGaAs-, AlGaN-, InGaN-, or GaN-based materials.

28. The light emitting diode according to claim 19, wherein said semiconductor layer comprises a p-type material.

29. The light emitting diode according to claim 19, said structure comprising a portion of said current spreading composite layer.

30. The light emitting diode according to claim 19, wherein a diameter of holes in said array ranges from 80 to 300 nm.

31. The light emitting diode according to claim 19, wherein a lattice constant of said structure ranges from about 100 to 400 nm.

32. The light emitting diode according to claim 19, wherein a lattice pattern of said structure lattice is triangular, rectangular or hexagonal.

33. The light emitting diode according to claim 19, said structure comprising a portion of said current spreading composite layer and the semiconductor layer.

34. A light emitting diode comprising:
an active light emission layer;
a Photonic Band Gap structure adjacent to the active layer;
a semiconductor layer over the active layer, said semiconductor layer passing light emitted by the active layer as light output from the diode; and a current spreading composite layer on said semiconductor layer, said composite layer comprising a first metallic layer in contact with said semiconductor layer, and a second current spreading layer in contact with said first metallic layer, said first and second layers substantially transparent to light emitted by the active layer, wherein said first metallic layer has a total thickness not more than about 8 nm, said structure comprising an array of holes in the current spreading composite layer and the semiconductor layer.

35. The light emitting diode according to claim 34, said active layer embedded in a waveguide layer.

36. The light emitting diode according to claim 35, said active layer comprising multiple quantum wells or double heterostructure in the waveguide layer.

* * * * *